(12) United States Patent
Ho

(10) Patent No.: US 9,841,459 B2
(45) Date of Patent: Dec. 12, 2017

(54) DEVICE AND METHOD FOR CONTROLLING IC TEMPERATURE

(71) Applicant: TEST21 TAIWAN CO., Ltd, HsinChu (TW)

(72) Inventor: Shun-Bon Ho, HsinChu (TW)

(73) Assignee: Test21 Taiwan Co., Ltd., Hsinchu (TW)

( * ) Notice: Subject to any disclaimer, the term of this patent is extended or adjusted under 35 U.S.C. 154(b) by 0 days.

(21) Appl. No.: 15/191,936

(22) Filed: Jun. 24, 2016

(65) Prior Publication Data

US 2017/0115339 A1 Apr. 27, 2017

(30) Foreign Application Priority Data

Oct. 26, 2015 (TW) .............................. 104135144 A
Feb. 25, 2016 (TW) .............................. 105105674 A

(51) Int. Cl.
*G01R 31/00* (2006.01)
*G01R 31/28* (2006.01)

(52) U.S. Cl.
CPC ................................ *G01R 31/2874* (2013.01)

(58) Field of Classification Search
CPC .............. G01R 1/0458; G01R 31/2884; G01R 31/2607; G01R 31/2874; G01R 31/2891; G01R 1/07378; G01R 31/003; G01R 31/2856; G01R 31/2875; G01R 31/2877
See application file for complete search history.

(56) References Cited

U.S. PATENT DOCUMENTS

| 6,549,026 B1 * | 4/2003 | DiBattista | .......... G01R 31/2891 324/224 |
| 2004/0232933 A1 * | 11/2004 | Maesaki | ............ G01R 31/2874 324/750.07 |
| 2017/0115339 A1 * | 4/2017 | Ho | ..................... G01R 31/2874 |

* cited by examiner

*Primary Examiner* — Tung X Nguyen
(74) *Attorney, Agent, or Firm* — Muncy, Geissler, Olds & Lowe, P.C.

(57) ABSTRACT

A device for controlling IC temperature capable of bringing a device-under-test to a predetermined temperature includes a compressor, temperature controller element, thermal sensing element, heat insulating structure, input/output terminal and a temperature controller. The compressor has a base and a contact portion contacting the DUT directly. The thermal sensing element is attached to the temperature controlling element contacting the base. The heat insulation structure surrounds the temperature controlling element and a portion of the compressor. The input/output terminal, having a signal line and at least one power line, is disposed on the heat insulation structure. The power and signal lines connected to the temperature sensor are connected to the temperature controlling element and thermal sensing element respectively. The temperature sensor powers the temperature controlling element and controls temperature thereof. Temperature of the temperature controlling element is obtained by measuring electrical properties of thermal sensing element via signal line.

10 Claims, 15 Drawing Sheets

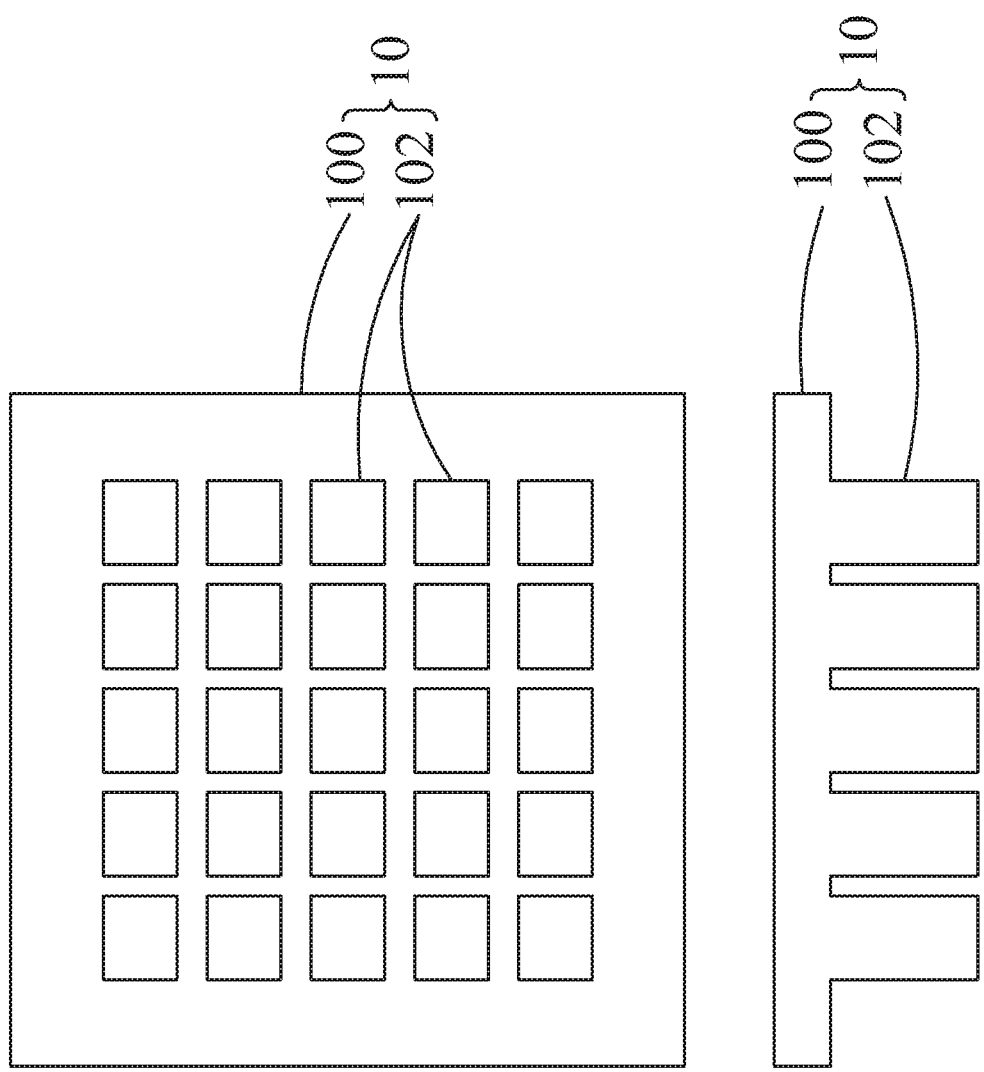

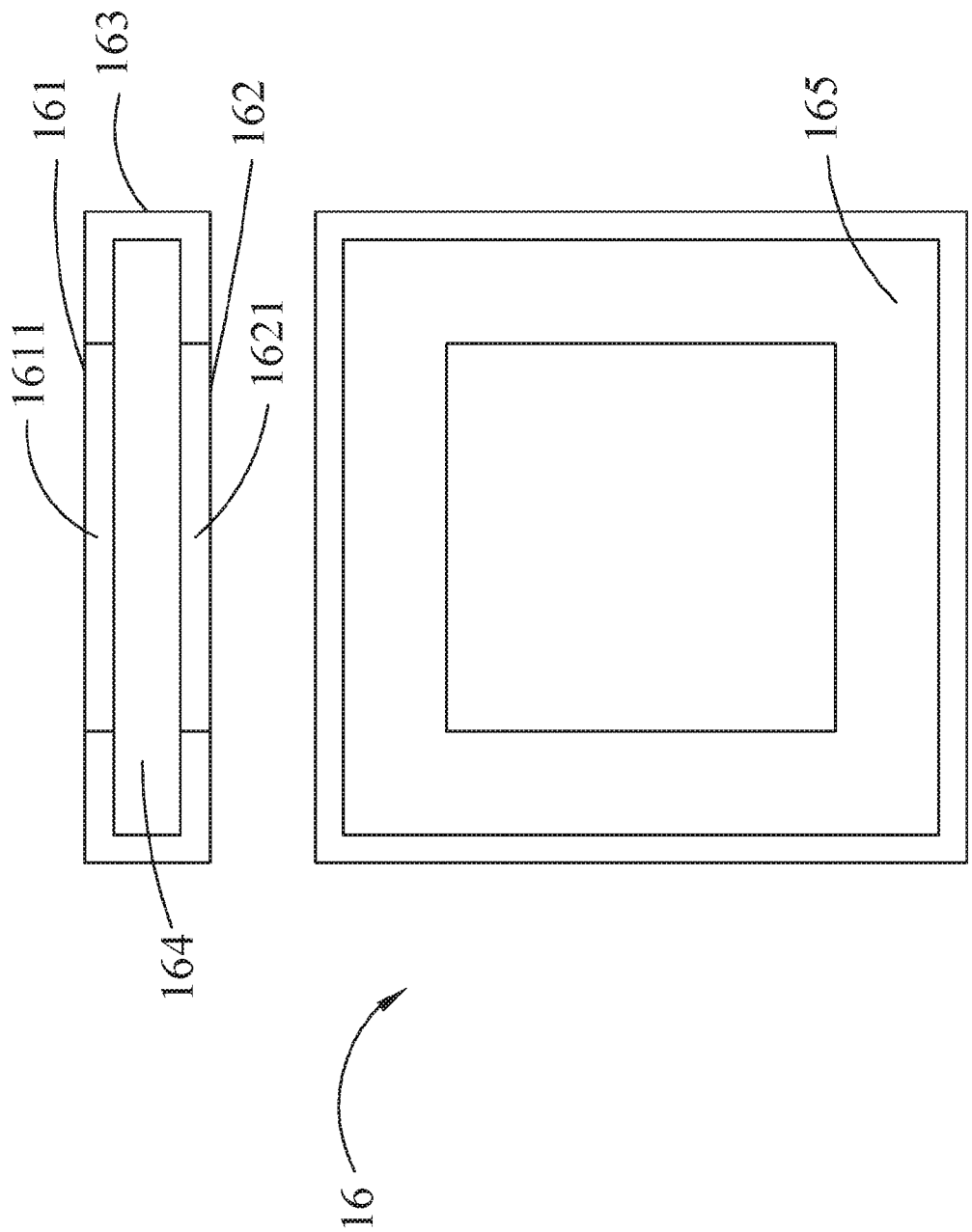

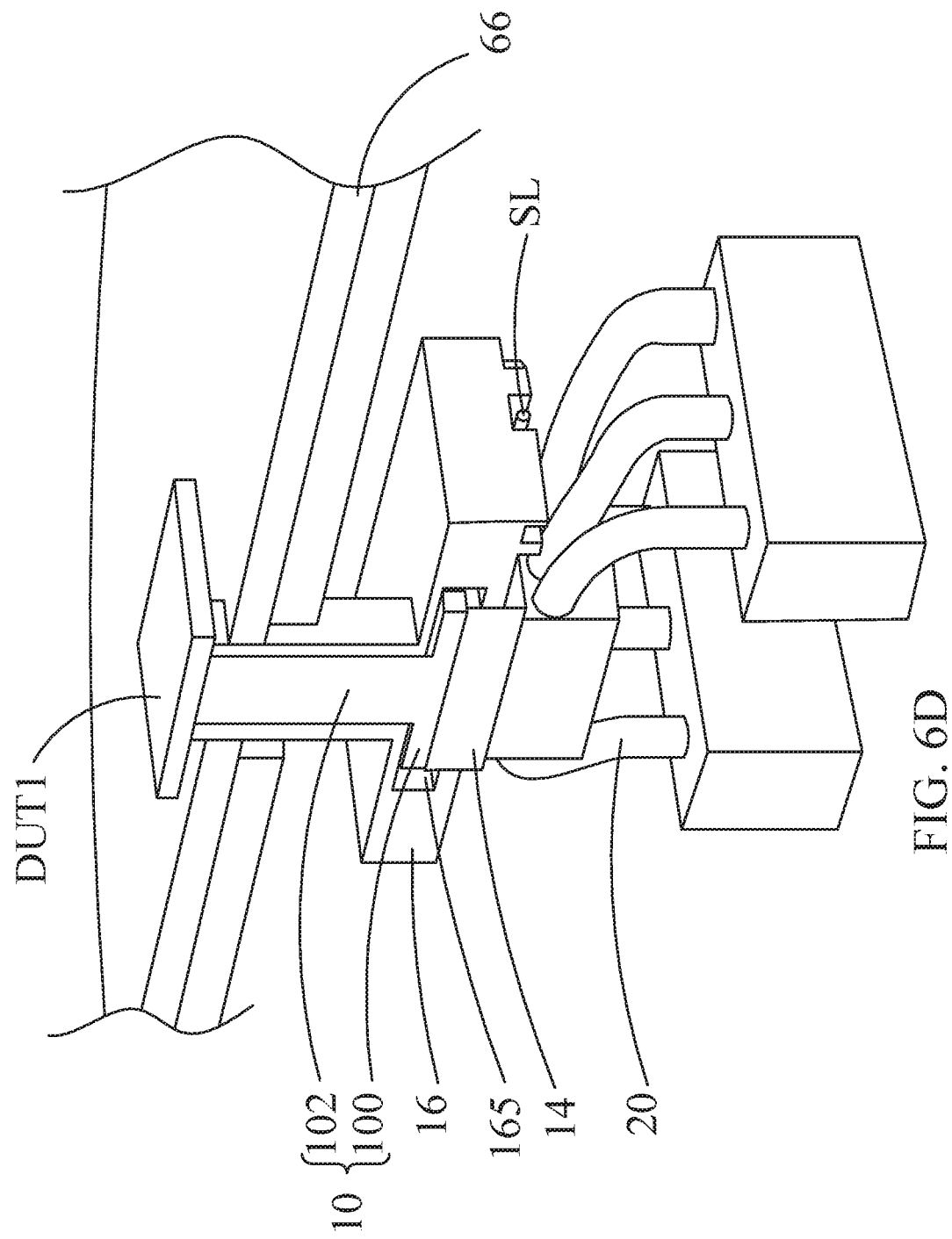

DEVICE AND METHOD FOR CONTROLLING IC TEMPERATURE

CROSS-REFERENCE TO RELATED APPLICATION

This application claims priority from Taiwan Patent Application Nos. 104135144 and 105105674, filed respectively on Oct. 26, 2015 and Feb. 25, 2016, in the Taiwan Intellectual Property Office, the contents of which are hereby incorporated by reference in their entirety for all purposes.

BACKGROUND OF THE INVENTION

1. Field of the Invention

The present invention relates a device and method for controlling integrated circuit (IC) temperature. More precisely, the present invention relates to a device and method for controlling IC temperature applicable to heating or cooling the IC and detecting the temperature thereof during IC performance test.

2. Description of the Related Art

Specifically, the miniscule IC inside the portable electronic device has a low wattage, i.e. approximately less than 2 W or even approximately 1 mW, thereby generating very little heat. So in certain countries with polar climate, the temperature of such an IC tends to drop due to the extremely cold surroundings. As intelligent vehicles start gaining traction, the ICs for these vehicles have to be able to withstand these harsh environments without malfunctioning. Therefore during the manufacturing process for ICs, the ICs of various sizes have to be tested to ensure operation thereof is not compromised under extreme temperature conditions, e.g. industrial grade temperatures (−40° C. to 120° C.) and automotive grade temperatures (above 175° C.).

Usually, the ICs will go through tests such as the Final Test and Reliability Test after packaging. The Final Test consists of heating and cooling the IC. In particular, the IC temperature is lowered to a predetermined value to test whether the IC is able to operate properly under extremely low temperatures, and then the IC temperature is raised to a predetermined value to test whether the IC is able to operate properly under extremely high temperatures. The duration of the Final Test is generally shorter than that of the Reliability Test. In the Reliability Test, the IC is maintained at a high or low temperature and operates continuously while being tested, so as to characterize the operational stability of the IC. During the Reliability Test, the tested IC is baked or cooled for an extended period of time, and all the while the IC is operating, for example for 2 to 3 weeks under a constant predetermined temperature while being tested.

The existing method for testing ICs involves placing the IC in the socket on the printed circuit board (PCB) and then heating up or cooling down the IC while performing tests thereto. A cooling agent may be applied to cool down the IC. The cooling agent cools the socket and the PCB while the IC is tested concurrently. However, since the cooling agent does not come into contact with the tested IC directly, it is difficult for the cooling agent to quickly lower the IC's core temperature despite it being able to lower its overall temperature. On top of that, such a cooling method cannot maintain the tested IC at a constant temperature. To heat the IC up, the tested IC is manually disposed on a hot plate such that the IC is heated to a predetermined temperature. Then the IC is manually moved to and mounted onto the socket, and its performance is tested. However, since the hot plate is no longer able to supply heat to the IC once it has left the hot plate, the IC's temperature drops due to thermal convection in the air while the IC is being moved from the hot plate to the socket and thermal conduction to the socket while the IC is in contact with the socket. Thus, such a heating method fails to maintain the tested IC at a constant temperature. It follows that the test results are inconsistent, since the IC is not tested under the intended constant temperature.

An alternative method for heating up the IC is using a heat gun. However, the use of a heat gun comes with a few caveats which are as follows. (1) Since the heat gun only heats up a specific area with hot air, the IC might not be heated up evenly. The temperature of the hot air cannot be precisely controlled, so the temperature of the hot air might be too high or insufficient. Also, even though the tested IC is thermally insulated by the thermal insulating structure, the hot air of the heat gun might still affect the temperature of the components around the tested IC. (2) Then, when the IC has reached the desired temperature, the heat gun is turned off. The IC then starts to slowly cool and no longer maintains the desired temperature during testing. (3) When the heat gun is heating the tested IC, the components around the IC and the PCB might be heated as well, so the test results might be inaccurate. (4) In order to test a small IC, the tested IC is disposed in the test socket and covered by a lid to ensure electrical contact. This test socket and lid stand in the way of the hot air from the heat gun, thereby making it difficult to heat up the small IC. (5) There is no way to determine the temperature of the IC during testing, let alone the required heating duration.

Another method for heating or cooling ICs involves the thermal stream system. This system is pricey and bulky, consumes a lot of power, and requires compressed gas or air from a compressor to operate. Furthermore, since the tested IC is disposed in the test socket and is of a small size, it might be difficult to heat up or cool down such an IC by applying a stream of hot or cold air. Moreover, the temperature sensor of the thermal stream system is usually disposed at a position where the thermal stream passes, so the temperature sensor will not accurately reflect the temperature of the tested IC. Besides, while it is possible to connect an IC thermocouple to the thermal stream system in order to obtain the IC's temperature, such a thermocouple is usually not disposed in the IC in the testing phase. So, in order to measure the temperature of the tested IC, the thermal stream system has to be connected to such a temperature sensor, which is in turn in contact with or attached to the tested IC to measure the temperature thereof.

The above mentioned method for heating or cooling the IC is extremely inconvenient and is also incapable of obtaining an accurate temperature reading of the IC. The thermal stream system heats up, cools down or maintains the IC at a constant temperature using air flow. However, the operation of thermal stream system on smaller ICs may be hindered due to the socket blocking the flow of air. Also, in particular, there is the need to wait and the extra use of electricity due to the time it takes, usually above 30 minutes, for the thermal stream system to heat up or cool down the IC. And even though a plurality of temperature sensors can be applied to measure the individual temperatures of a plurality of ICs, the configurations of the temperature sensors have to be readjusted for further testing of the ICs. Hence, such a solution is not convenient to use and renders the IC test inefficient. On top of that, during the heating or cooling of the tested IC, the components around the IC might also be heated or cooled. So, the thermal stream system is not capable of solely heating up or cooling down the IC, which leads to the likely deviation from optimum working temperatures of the surrounding components. Therefore, the results for the IC test are significantly affected. In addition, because the surrounding components tend to deviate from optimum working temperatures, locating any faulty ICs will be a challenging task when testing a plurality of ICs. This is thus an inconvenient method for temperature testing of ICs.

SUMMARY OF THE INVENTION

In order to address the aforementioned technical issues, the objective of the present invention is to provide a device for controlling IC temperature, which is adapted to bring a device-under-test (DUT) to a predetermined temperature for testing purposes. The device for controlling IC temperature includes a compressor, a temperature controlling element, a thermal sensing element, a heat insulating structure, an input/output (I/O) terminal and a temperature controller. The compressor has a base and a contact portion, the contact portion extends from the base and is configured to directly contact the DUT. The temperature controlling element is disposed on the compressor, wherein one side of the temperature controlling element contacts the base and the other side is disposed with a heat dissipation module. The thermal sensing element is attached to the temperature controlling element. The heat insulating structure is disposed around the temperature controlling element and at least a portion of the compressor, and at least partially exposes the contact portion. The heat insulating structure includes an accommodating space to accommodate the temperature controlling element and at least the portion of the compressor. The I/O terminal is disposed on the heat insulating structure. The I/O terminal includes a power line and a signal line. The power line is electrically connected to the temperature controlling element and the signal line is electrically connected to the thermal sensing element. The temperature controller is connected to the power line and the signal line. The temperature controller supplies power to the power line, controls the rise or drop of the temperature of the temperature controlling element, and measures the electrical properties of the thermal sensing element via the signal line to obtain the temperature of the temperature controlling element by calculation.

Preferably, the temperature controller includes a user interface for controlling and displaying the temperature of the temperature controlling element.

Preferably, the heat insulating structure includes an upper base, a lower base, an outer wall and at least one heat insulating recess. The upper base has an upper hollow portion at a center thereof. The lower base is disposed opposite to the upper base has a lower hollow portion at a center thereof. The outer wall is interposed between the upper base and the lower base along the outermost region of the upper base and the lower base. The at least one heat insulating recess is interposed between the upper base and the lower base. The at least one heat insulating recess, the upper base, the lower base, the temperature controlling element and at least the portion of the compressor cooperatively form at least one enclosed space.

Preferably, the temperature controlling element includes a cooling plate. The anode and cathode of the cooling plate are respectively connected to the temperature controller via a reversing switch. The temperature controller is configured to switch the reversing switch to a first conducting state during cooling or switch to a second conducting state during heating, such that a side of the cooling plate contacting the compressor cools down or heats up accordingly.

According to another objective of the present invention a device for controlling IC temperature is provided. The device for controlling IC temperature is adapted for adjusting a temperature of a DUT to a predetermined value for testing and includes a compressor, at least one temperature controlling element, a thermal sensing element, a heat insulating structure, and I/O terminal. The compressor has a base and a plurality of contact portions. The plurality of contact portions extend from the base and are configured to directly contact the DUT. The at least one temperature controlling element is disposed on the compressor and contacting the base. The thermal sensing element is attached to the temperature controlling element. The heat insulating structure is disposed around the at least one temperature controlling element and at least a portion of the compressor. The heat insulating structure includes an accommodation space for accommodating the at least one temperature controlling element and at least the portion of the compressor. The I/O terminal is disposed on the heat insulating structure. The I/O terminal includes a power line and a signal line, the power line is electrically connected to the at least one temperature controlling element and the signal line is electrically connected to the thermal sensing element.

Preferably, the device for controlling IC temperature may further include a temperature controller connected to the power line and the signal line. The temperature controller supplies power to the power line, adjusts a temperature of the temperature controlling element, and measures electrical properties of the thermal sensing element via the signal line to obtain the temperature of the temperature controlling element by calculation.

Preferably, the device for controlling IC temperature may further include a heat dissipation module disposed on the temperature controlling element.

Preferably, the heat insulating structure may include an upper base, a lower base, an outer wall and at least one heat insulating recess. The upper base has an upper hollow portion at a center thereof. The lower base corresponds to the upper base and has a lower hollow portion at a center thereof. The outer wall is interposed between the upper base and the lower base along the outermost region of the upper base and the lower base. At least one heat insulating recess is interposed between the upper base and the lower base. The at least one heat insulating recess, the upper base, the lower base, the temperature controlling element and at least the portion of the compressor cooperatively form at least one enclosed space.

Preferably, the temperature controlling element includes a cooling plate. The anode and the cathode of the cooling plate are respectively connected to the temperature controller via a reversing switch, the temperature controller is configured to switch the reversing switch to a first conducting state during cooling or switch to a second conducting state during heating, such that a side of the cooling plate contacting the compressor cools down or heats up accordingly.

According to yet another objective of the present invention, a method for controlling IC temperature is provided. The method for controlling IC temperature is adaptable to the aforementioned device for controlling IC temperature, and may include steps as follows: connecting the temperature controller to the power line and the signal line of the I/O terminal for electrically connecting the temperature controlling element and the thermal sensing element respectively; using the temperature controller to control rise or drop of the temperature of the temperature controlling element via the power line; contacting the compressor with the DUT to allow heat transfer between the DUT and the temperature controlling element; controlling the temperature controller to measure electrical properties of the thermal sensing element via the signal line; and obtaining the temperature of the temperature controlling element by calculating electrical properties of the thermal sensing element using the temperature controller.

In conclusion, contrary to techniques known in the art, the device and method for controlling IC temperature of the present invention is capable of rapidly heating or cooling the IC in various sizes to a certain temperature, and precisely maintaining the temperature of the IC at a constant value for testing. Specifically, the device and method for controlling IC temperature of the present invention conducts heat by contacting the tested IC with the compressor, therefore the present invention heats up or cools down the IC by direct contact during the heating or cooling for IC performance test. So, in contrast to techniques known in the art, which transfer heat by using a fan to blow a stream of hot or cold air, the present invention is faster, simpler, more economic, more convenient, saves more power and so is more environmentally friendly. Besides, the heat insulating structure with a plurality of heat insulating walls and an outer wall forms a plurality of heat insulating air walls which effectively block unwanted thermal energy from entering the DUT during cooling or effectively prevent the unwanted loss of thermal energy during heating, such that the rate of heating or cooling of the DUT is accelerated accordingly. Furthermore, the temperature controller of the present invention is capable of accurately measuring the temperature of the temperature controlling element when the temperature controlling element, compressor and DUT reaches thermal equilibrium due to the closed loop formed by the power line, signal line, and the temperature controller, thereby being highly adaptable and accelerating efficiency during measuring. Furthermore, the present invention may be disposed with the cooling plate and the reversing switch to achieve the function of heating and cooling without the need for additional elements.

BRIEF DESCRIPTION OF THE DRAWINGS

Various features and advantages of the present invention will be made evident by the detailed descriptions of the exemplary embodiments with reference to the attached drawings hereinafter, in which:

FIG. 1D is the schematic diagram illustrating another embodiment of the compressor according to the embodiment of the device for controlling IC temperature of the present invention.

FIG. 2A is the plan view illustrating the first embodiment of the heat insulating structure according to the embodiment of the device for controlling IC temperature of the present invention.

FIGS. 6A to 6D are the schematic diagrams illustrating temperature control operation of the device for controlling IC temperature of the present invention.

DESCRIPTION OF THE PREFERRED EMBODIMENTS

Figure 1A:
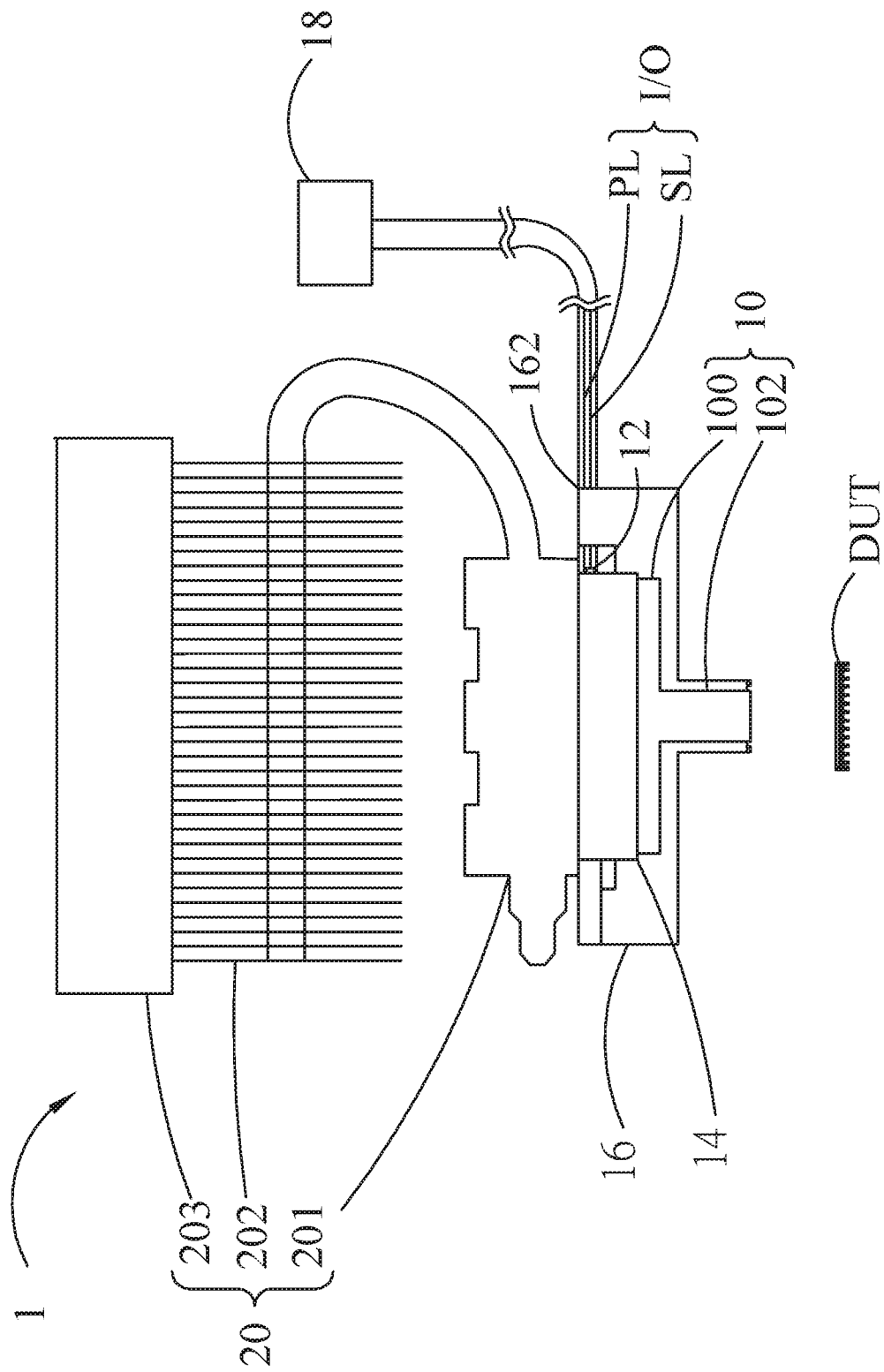
FIG. 1A is the sectional view of an embodiment according to the device for controlling IC temperature of the present invention.

Reference will now be made in detail to the exemplary embodiments of the present disclosure, examples of which are illustrated in the accompanying drawings. Therefore, it is to be understood that the foregoing is illustrative of exemplary embodiments and is not to be construed as limited to the specific embodiments disclosed, and that modifications to the disclosed exemplary embodiments, as well as other exemplary embodiments, are intended to be included within the scope of the appended claims. These embodiments are provided so that this disclosure will be thorough and complete, and will fully convey the inventive concept to those skilled in the art. The relative proportions and ratios of elements in the drawings may be exaggerated or diminished in size for the sake of clarity and convenience in the drawings, and such arbitrary proportions are only illustrative and not limiting in any way. The same reference numbers are used in the drawings and the description to refer to the same or like parts.

Hereinafter, the term "and/or" refers to the inclusion of any or all combinations of one or more listed items associated therewith. The term 'at least one' prefixing an item listing applies to all items in the list instead of the individual item of the list.

FIG. 1A is the sectional view of an embodiment according to the device for controlling IC temperature of the present invention. As shown in the figures, the device for controlling IC temperature 1 of the present invention is adapted for cooling down or heating up a device-under-test (DUT) in addition to measuring the temperature of the device-under-test DUT. The device for controlling IC temperature 1 may include a compressor 10, a thermal sensing element 12, a temperature controlling element 14, a heat insulating structure 16, input/output (I/O) terminal I/O, a temperature controller 18 and a heat dissipation module 20.

The compressor 10 has a base 100 and a contact portion 102. The contact portion 102 is configured to directly contact the DUT. The contact portion 102 may protrude out of the base 100. Here, the compressor 10 may be formed of a thermal conducting material e.g. metal, which is designed to be able to rapidly conduct heat.

The DUT may be electrically connected to the printed circuit board (PCB) in advance, as well as connected to the IC performance test device. Such configuration is known to the person skilled in the art so unnecessary detail is omitted.

Preferably, the compressor 10 may be capable of heating up or cooling down ICs of various sizes with the Wafer-Level Chip Scale Packaging.

The thermal sensing element 12 is attached to the temperature controlling element 14 and connected to the signal line SL. Generally speaking, the thermal sensing element 12 could be an active or passive component which includes the resistor, capacitor and the inductor. The thermal sensing element 12 may be constructed from layers of material with different thermal expansion coefficients. The thermal sensing element 12 could be thermal sensing IC, transistor or diode too. Preferably, the temperature variation of the temperature controlling element 14 will cause the electrical properties variation of the thermal sensing element 12, and the thermal sensing element 12 could be a thermistor, the thermistor is configured such that the resistance thereof changes as the temperature changes and the rate of change of resistance with respect to temperature change is much larger than ordinary resistors. Such resistor is widely applied to various electronic devices, such as inrush current limiter, temperature sensor, polymeric positive temperature coefficient device (PPTC), self-regulating heating elements, etc. The thermal sensing element 12 which is applicable to different temperature range may be made of ceramic or polymer, and may possess different temperature response.

Furthermore, the temperature controlling element 14 is disposed on the compressor 10, wherein one side of the temperature controlling element 14 contacts the base 100 of the compressor 10. When the temperature controlling element 14 is heating up or cooling down, the temperature of the compressor 10 contacting the temperature controlling element 14 varies according to the variation of the temperature thereof. In particular, the temperature controlling element 14 may be constituted by one or more cooling plate, since the person skilled in the art should be familiar with the detail pertaining to the cooling plate, such description is therefore omitted. Besides, the temperature controlling element 14 is disposed with electrodes for subsequent connection with the power line PL to achieve heating or cooling. The temperature controlling element 14 may be the stack of one or more cooling plates, the person skilled in the art should be familiar with the related detail, hence such detail is left out for simplicity.

Figure 1B:
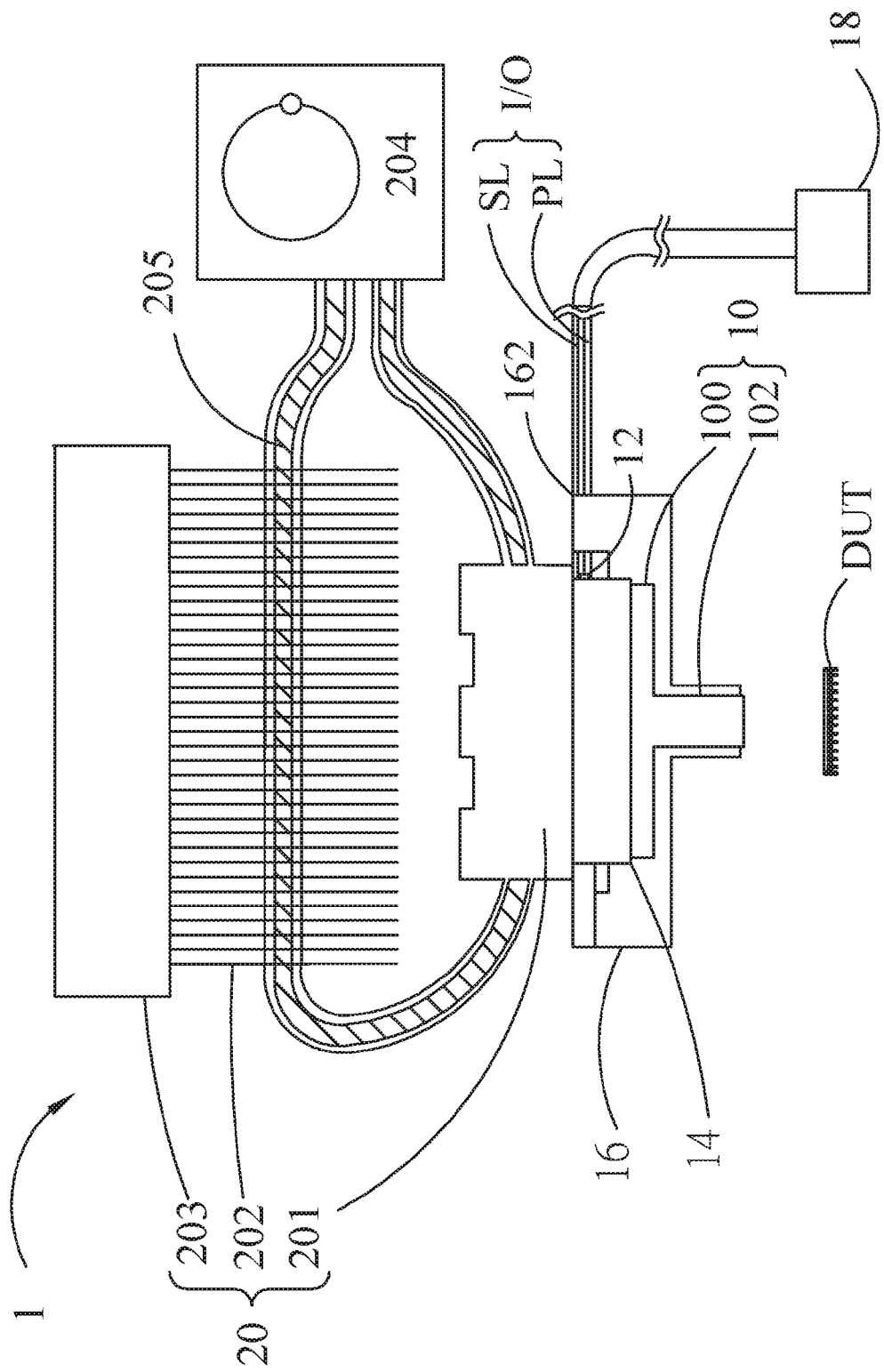
FIG. 1B is the sectional view of another embodiment according to the device for controlling IC temperature of the present invention.
Figure 1C:
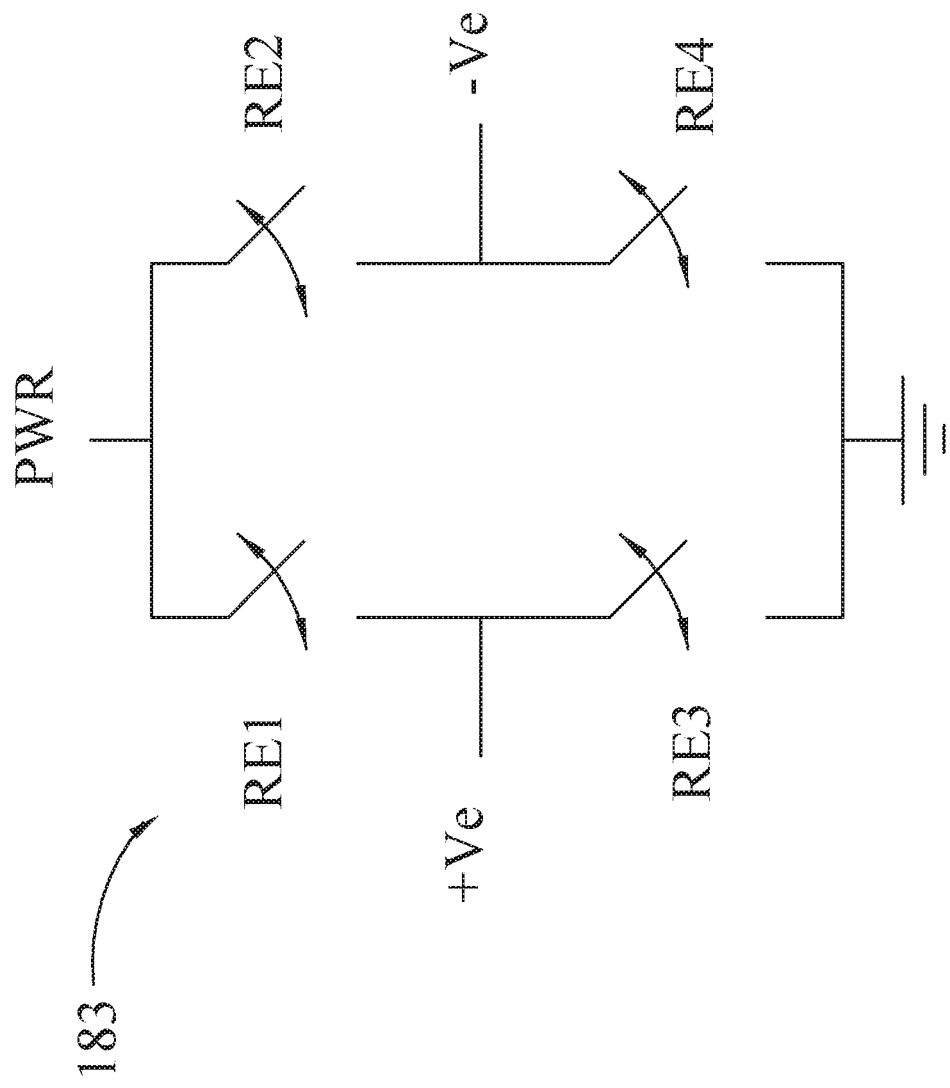
FIG. 1C is the circuit layout of the reversing switch of the device for controlling IC temperature of the present invention.

Referring to FIG. 1C, which is the circuit layout of the reversing switch of the device for controlling IC temperature of the present invention. As can be appreciated in the figure, the temperature controller 18 may be further connected to the anode and cathode of the cooling plate (i.e., the temperature controlling element 14) via the reversing switch 183. The temperature controller 18 is configured to switch the reversing switch 183 to the first conducting state during cooling, such that the side of the cooling plate contacting the compressor 10 is cooled down, or the reversing switch 183 is switched to the second conducting state during heating, such that the side of the cooling plate contacting the compressor 10 is heated up.

In the practical embodiment, a plurality of relays may be arranged to form the reversing switch 183, as shown in the figure. The plurality of relays may be respectively connected to the power source PWR, positive voltage +Ve, negative voltage −Ve and the ground terminal. The temperature controller 18 switches the reversing switch 183 to the first conducting state during cooling. Precisely, the first relay RE1 and fourth relay RE4 are closed while the second relay RE2 and the third relay RE3 are opened, thereby passing the forward current through the anode and cathode of the cooling plate. Under the circumstances the side of the cooling plate contacting the compressor 10 may cool down to −40° C. or lower. On the other hand, the temperature controller 18 switches the reversing switch 183 to the second conducting state during heating. In particular, the second relay RE2 and the third relay RE3 are closed while the first relay RE and fourth relay RE4 are opened, thereby passing the backward current through the anode and cathode of the cooling plate. At the moment the side of the cooling plate contacting the compressor 10 may heat up to 120° C. or above. Therefore, the cooling plate and the reversing switch 183 of the present invention is capable of achieve both functions of heating and cooling without the need for additional elements.

Moreover, referring to FIG. 1D, which is the schematic diagram illustrating another embodiment of the compressor according to the device for controlling IC temperature of the present invention. As shown in the figure, the compressor 10 may include the base 100 and a plurality of contact portions 102 corresponding to the position of each of the plurality of ICs, such that all ICs can be simultaneously heated up or cooled down during heating or cooling. The amount, area and position of the contact portions 102 is adjustable according to the user requirement, therefore not limited to the configuration illustrated in the present embodiment.

In a preferred embodiment of the present invention, one side of the temperature controlling element 14 may be disposed with the heat dissipation module 20 for dissipating the heat from the temperature controlling element 14 to the outer surroundings during cooling. As shown in the figure, the heat dissipation module 20 may include a plurality of heat pipes 201, heatsink 202, and fan 203. The cooling efficiency of the heat dissipation module 20 depends on various factors such as the amount of heat pipes 201, the area of the heatsink 202 and the mass flow rate of the fan 203, therefore the user can adjust the specification of the heat dissipation module 20 according to the actual need, since such adjustment is well-known to the person skilled in the art, the detail thereof is hot given herein. In the other hand, the fan 203 is turned off during heating to avoid undesired heat loss.

Referring to FIG. 1A again, the device for controlling IC temperature 1 of the present invention may further include the input/output terminal (I/O). The I/O terminal is disposed at the external of the heat insulating structure 16 and may further penetrate the heat insulating structure 16. The I/O terminal includes at least the power line PL and the signal line SL, wherein the power line PL is electrically connected to the temperature controlling element 14 while the signal line SL is electrically connected to the thermal sensing element 12. In other words, the power line PL may penetrate the through hole 160 to electrically connect to the electrode of the temperature controlling element 14 and the signal line SL may penetrate the through hole 160 to electrically connect to the electrode of the thermal sensing element 12.

Besides, according to an embodiment of the present invention, the heat insulating structure 16 is disposed around the temperature controlling element 14 and the base 100 of the compressor 10 while exposes at least a part of the contact portion 102. The heat insulating structure 16 may serve as the housing for accommodating the temperature controlling element 14 and the compressor 10, therefore the heat insulating structure 16 may further include an accommodation space for such purpose. The configuration of the heat insulating structure 16 will be set forth in detail hereinafter.

FIG. 2A is the plan view illustrating the first embodiment of the heat insulating structure according to the device for controlling IC temperature of the present invention. The heat insulating structure 16 may include an upper base 161, a lower base 162 and an outer wall 163 cooperatively forming the heat insulating recess 165. An upper hollow portion 1611 is disposed at the center of the upper base 161. The lower base 162 is disposed opposite to the upper base 161, and a lower hollow portion 1621 is located at the center of the lower base 162. The outer wall 163 is interposed between the upper base 161 and the lower base 162 along the outermost region of the upper base 161 and the lower base 162. When the heat insulating structure 16, temperature controlling element 14 and base 100 of the compressor 10 are assembled, an enclosed space is formed. The enclosed space has the air layer for heat insulation. The air layer may effectively prevent the temperature controlling element 14 and the compressor 10 from exchanging heat with the outside during cooling or heating, therefore the present invention is capable of rapidly cooling or heating the DUT. In other words, when the cooled or heated compressor 10 reaches a predetermined temperature, the heat insulating structure 16, the temperature controlling element 14 and the compressor 10 are configured to form a cold preserving mechanism or a thermal insulation mechanism, when the DUT contacts with the compressor 10, the compressor 10 is able to swiftly dissipate the heat from the DUT or conduct the heat to the DUT, such that rapid cooling or heating is achieved. In the preferred embodiment of the present invention, the smaller IC can be cooled to −40° C. or heated to 120° C. in just 3 minutes.

Figure 2B:
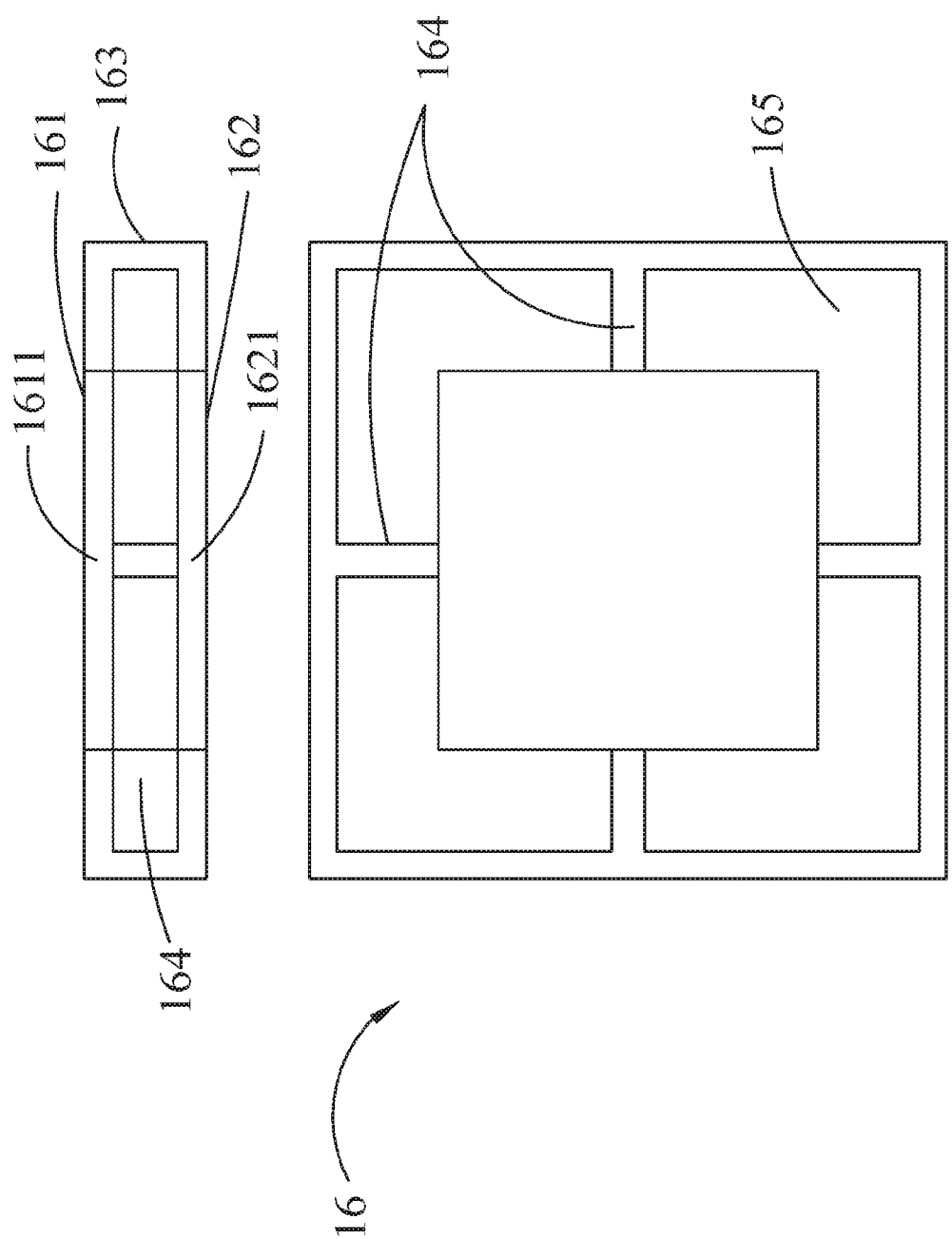
FIG. 2B is the plan view illustrating the second embodiment of the heat insulating structure according to the embodiment of the device for controlling IC temperature of the present invention.

FIG. 2B is the plan view illustrating the second embodiment of the heat insulating structure according to the device for controlling IC temperature of the present invention. As shown in the figure, a plurality of heat insulating walls 164 form a plurality of heat insulating recesses 165 in between the upper base 161 and the lower base 162, wherein the plurality of heat insulating walls 164 extend from the outer wall 163 to the center of the heat insulating structure 16. The plurality of heat insulating walls 164 are laid against the temperature controlling element 14 and the base 100 of the compressor 10, whereas the upper hollow portion 1611, the lower hollow portion 1621 and the plurality of heat insulating walls 164 cooperatively form the accommodation space.

It is noteworthy that the line to surface contact is formed when the plurality of heat insulating walls 164 are laid closely against the temperature controlling element 14 and the base 100 of the compressor 10, i.e., the contact surface is minimized such that the thermal conduction from the temperature controlling element 14 and the compressor 10 to the heat insulating structure 16 can be minimized. Meanwhile, the plurality of heat insulating walls 164 form a plurality of enclosed spaces. Since the air is a poor thermal conductor, the thermal conduction due to the contact between the temperature controlling element 14 and the external components can be minimized when the temperature controlling element 14 is cooling down or heating up, and the DUT can reach the predetermined temperature in no time. As a result, the rate of cooling or heating of the present invention can be dramatically improved and the power consumption thereof can be reduced.

The heat insulating structure 16 may be made from the heat insulating material such as the industrial plastic. Furthermore, the heat insulating structure 16 may have through hole such that the power line PL and the signal line SL is able to pass through the through hole and electrically connect to temperature controlling element 14 and thermal sensing element 12 respectively. As a result, the cost and extra space for additional wiring can be saved.

Figure 2C:
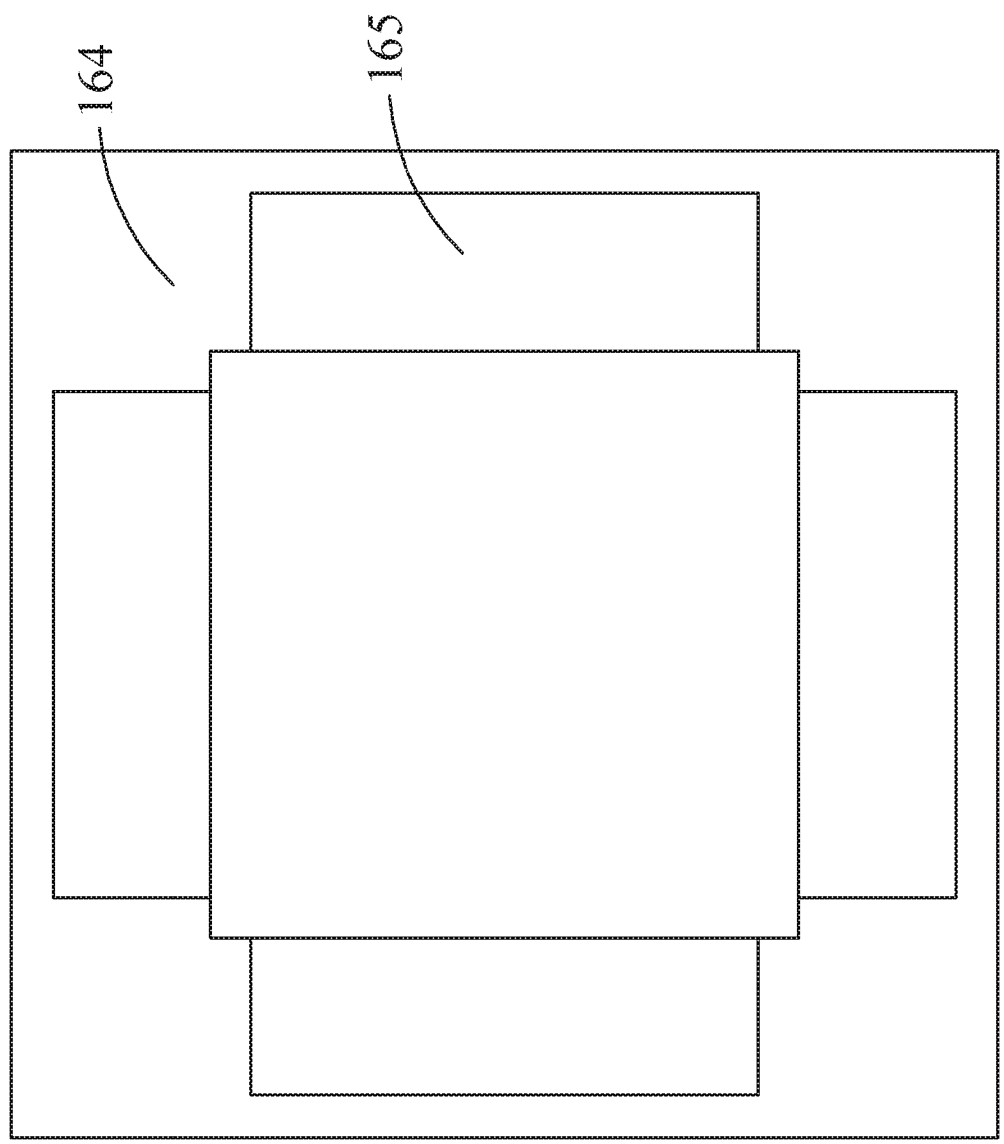
FIG. 2C is the plan view illustrating the first embodiment of the heat insulating structure according to the embodiment of the device for controlling IC temperature of the present invention.

FIG. 2C is the plan view illustrating the first embodiment of the heat insulating structure according to the device for controlling IC temperature of the present invention. As suggested un the figure, in contrast to the previous embodiment, that the plurality of heat insulating walls 164 of the present embodiment are in the shape of blocks and are disposed at the corners of the heat insulating structure 16, so as to form a plurality of heat insulating grooves 165 capable of reducing the contact surface between the heat insulating walls 164 and both the temperature controlling element 14 and the compressor 10. As a result, the present invention with air layer in the enclosed space is able to rapidly heat up or cool down the DUT.

Referring back to FIG. 1A, the temperature controller 18 may connect to the power line PL and the signal line SL to form a closed loop in order to supply power to the power line PL and control the temperature of the temperature controlling element 14. The temperature controller 18 may further measure the electrical properties of the thermal sensing element 12 through the signal line SL. Specifically, the temperature controller 18 is configured to measure the voltage and current of the thermal sensing element 12, and subsequently calculate the temperature of the temperature controlling element 14. In particular, the temperature controller 18 may include the controller such as the Central Processing Unit (CPU) or Micro Controlling Unit (MCU) capable of materializing the firmware, hardware or software for the aforementioned controlling or calculating functions. The controller may be connected to the external power or internal battery to deliver power to the present invention.

FIG. 1B is the sectional view of another embodiment according to the device for controlling IC temperature of the present invention. In contrast to the embodiment in FIG. 1A, the heat dissipation module 20 may be a water-cooling heat dissipation module. Wherein the heat pipe 201 exchanging heat near the temperature controlling element 14 is a circulating structure connected to the water-cooling pump 204. The heat pipe may contain cooling water 205, and the water-cooling pump 204 is configured to circulate the cooling water 205 inside the heat pipe 201, such that the heat absorbed by the cooling water 205 can be dissipated at the heatsink 202 and the fan 203 via circulation, and then the cooled cooling water 205 is recycled to exchange heat near the temperature controlling element 14 again, as such the present invention is able to achieve rapid heat dissipation. The heat dissipation module 20 is turned off during heating to avoid unnecessary heat loss.

The heat dissipation module of the present invention is different from the conventional heat dissipation module, since ordinary heat dissipation module is applied to dissipate heat of system, device, apparatus, etc., whereas the heat dissipation module 20 of the present invention e.g. the water cooling heat dissipation module only further assist the temperature controlling element 14 to reach the predetermined temperature sooner during cooling instead of being the major source of cooling for the compressor 10 and the DUT. In particular, the heat dissipation module 20 exchanges heat with the side opposite to where the temperature controlling element 14 controls temperature, thereby preventing the heat conducted from the DUT to the temperature controlling element 14 from accumulating therein. As a result, the cooling efficiency is improved and the DUT and the compressor 10 can be cooled to the predetermined temperature sooner.

Figure 3:
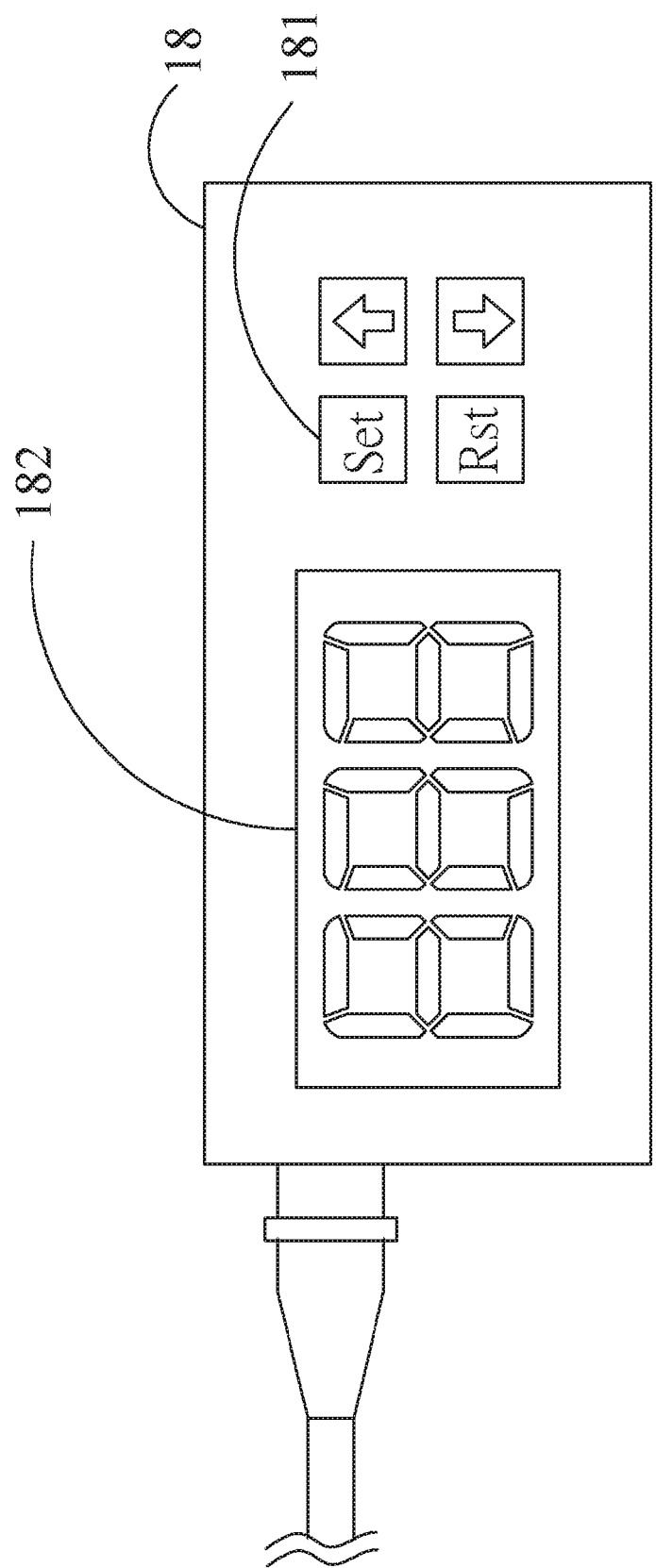
FIG. 3 is the schematic diagram illustrating the temperature controller of the device for controlling IC temperature of the present invention.

FIG. 3 is the schematic diagram illustrating the temperature controller of the device for controlling IC temperature of the present invention. Preferably, the temperature controller 18 may further include a user interface 181 and the display panel 182 for displaying the user interface 181, such that the user is able to control the temperature of the temperature controlling element 14 and view the calculated temperature sensed by the thermal sensing element 12.

In addition, in the preferred embodiment of the present invention, the temperature controller 18 may be disposed with the feedback control function, i.e. the user can set the test temperature of the DUT via the user interface so that the temperature controller 18 can automatically control the temperature controlling element 14 to stop heating or cooling the DUT once the DUT reaches the predetermined test temperature. On the other hand, when the IC is cooled or heated beyond a threshold value, the temperature controller 18 is able to detect that the DUT has not reached the predetermined temperature and then control the temperature controlling element 14 to continue heating or cooling so that the IC is able to reach the test temperature. Furthermore, the threshold value is configurable. For instance, the threshold value may be set at −50° C., when the temperature of the DUT is 1° C. above the threshold value, the temperature controller 18 control the temperature controlling element 14 to continue cooling the DUT. With the configuration of the present embodiment, the user can be saved from the hassle of having to monitor the temperature at all times and the DUT can be maintained at a stable test temperature.

Contrary to the present art, the device for controlling IC temperature of the present invention adopted the contact-type thermal conductive compressor which is capable of cooling down or heating up the chips by direct contact during the heating or cooling performance test for the IC. Furthermore, the present invention has low power consumption i.e. less than approximately 150 W in contrast to the thermal stream system of the known art which performs thermal convection and consumes 4 kW to 5 kW, therefore the present invention is faster, simpler, more economic, more convenient, more power saving as well as environmental friendly and does not require compressed gas. Besides, the heat insulating structure having a plurality of heat insulating walls is able to effectively cut down the unnecessary heat loss, thereby reducing the time taken by the DUT to reach the predetermined temperature and enhancing the test efficiency. Moreover, in certain embodiments of the present invention, the temperature controller is able to precisely control the temperature of the temperature controlling element through the power line and the signal line, therefore the present invention is highly adaptable and has high test efficiency.

Figure 4:
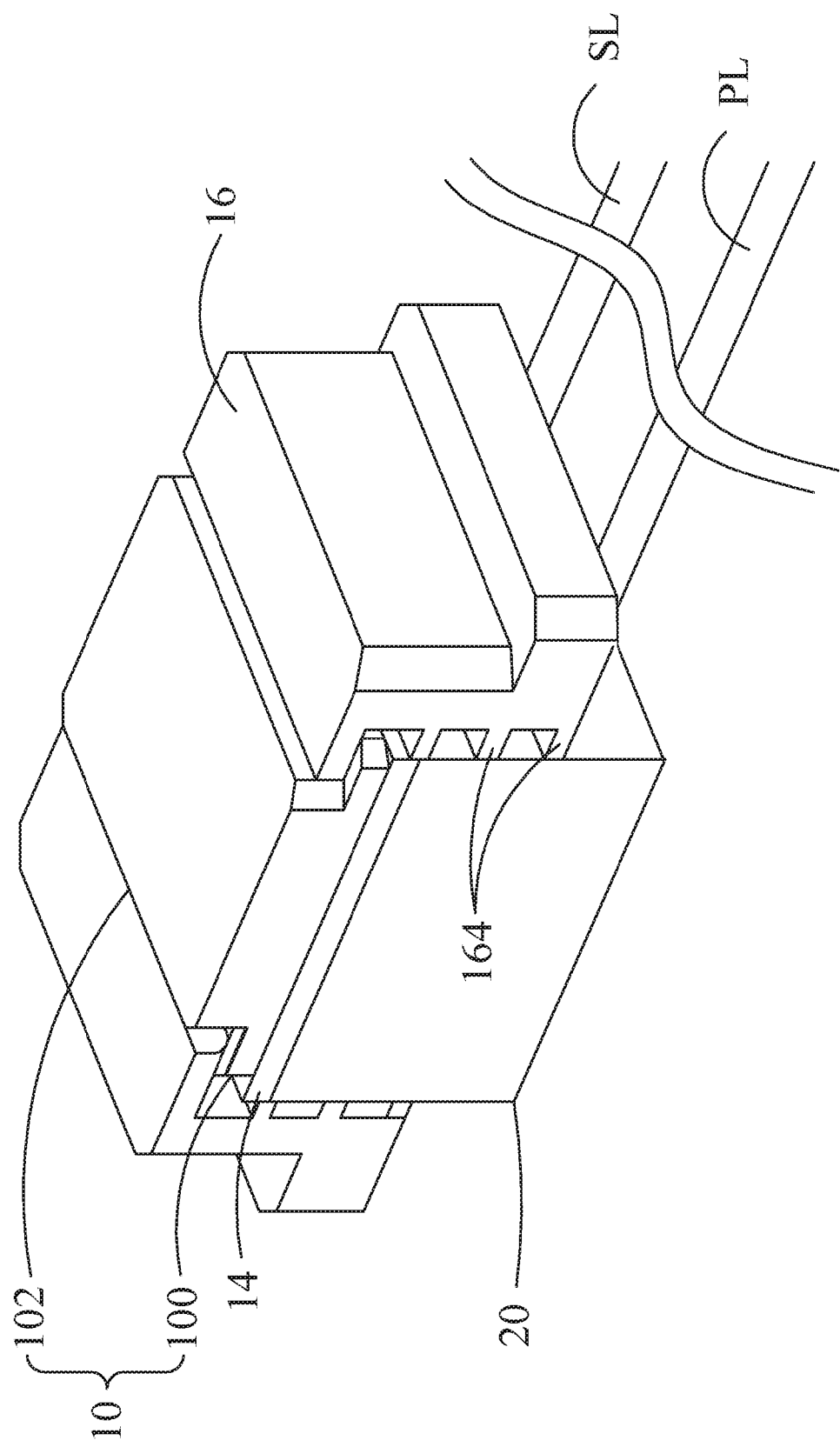
FIG. 4 is the schematic diagram illustrating another embodiment of the device for controlling IC temperature of the present invention.

FIG. 4 is the schematic diagram illustrating another embodiment of the device for controlling IC temperature of the present invention. Hereinafter, the other embodiment of the compressor, temperature controlling element and the heat insulating structure will be set forth, whereas the other details will be omitted since the rest of the components are identical to those in the previous embodiments.

As shown in the figure, in the present embodiment the compressor 10 may also include the base 100 and the contact portion 102 the contact portion 102 is configured to directly contact the DUT. The contact portion 102 may protrude from the base 100. The temperature controlling element 14 is disposed on the compressor 10 and one side thereof contacts base 100 of the compressor 10. When the temperature controlling element 14 starts cooling, the compressor 10 contacting the temperature controlling element 14 cools down as well. In contrast to the previous embodiment, the plurality of heat insulating walls 164 of the heat insulating structure 16 of the present embodiment are arranged horizontally and the contact portion 102 of the compressor 10 is configured to heat up or cool down at the position below the DUT. The advantage of the present embodiment is that the device for controlling IC temperature can be modified according to different designs of the DUT such that the user requirement is met.

Figure 5:
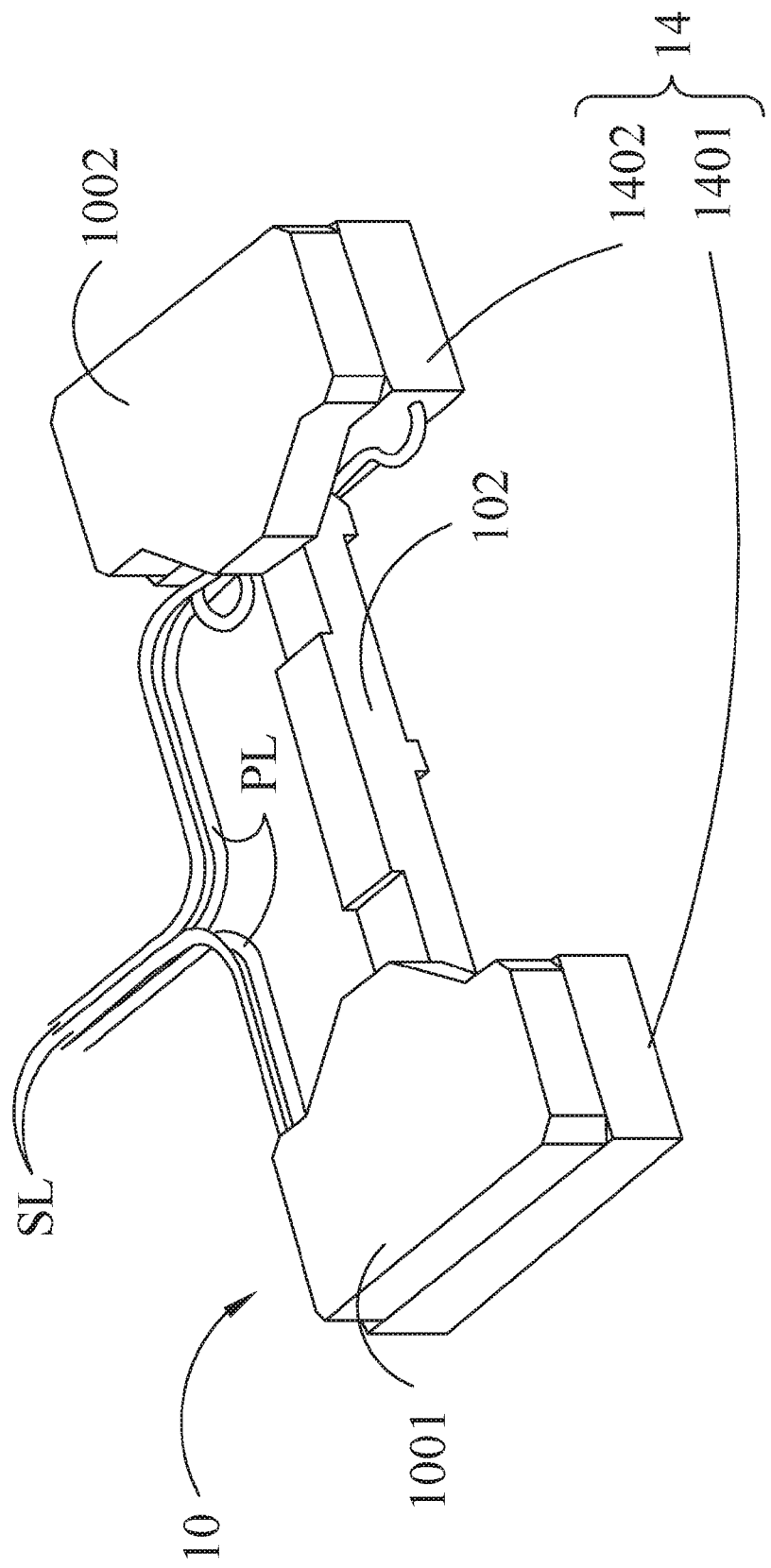
FIG. 5 is the schematic diagram illustrating yet another embodiment of the device for controlling IC temperature of the present invention.

FIG. 5 is the schematic diagram illustrating yet another embodiment of the device for controlling IC temperature of the present invention. Hereinafter, the yet another embodiment of the compressor, temperature controlling element and the heat insulating structure will be set forth, whereas the other details will be omitted since the rest of the components are identical to those in the previous embodiments.

As shown in the figure, the compressor 10 of the present embodiment includes the first base 1001 and the second base 1002, and the contact portions 102 respectively extend from one side of the first base 1001 and the second base 1002 to connect the first base 1001 and the second base 1002. The temperature controlling element 14 includes the first temperature controlling element 1401 and the second temperature controlling element 1402 respectively contacting the first base 1001 and the second base 1002 of the compressor 10. The power line PL delivers power to the temperature controlling element 14, and the signal line SL is connected to the thermal sensing element (not shown in the figure) attached to the first and second temperature controlling elements 1401 and 1402. In the present embodiment, the contact portion 102 of the compressor 10 may be configured to heat up or cool down at the position below the DUT as well.

Figure 6A:
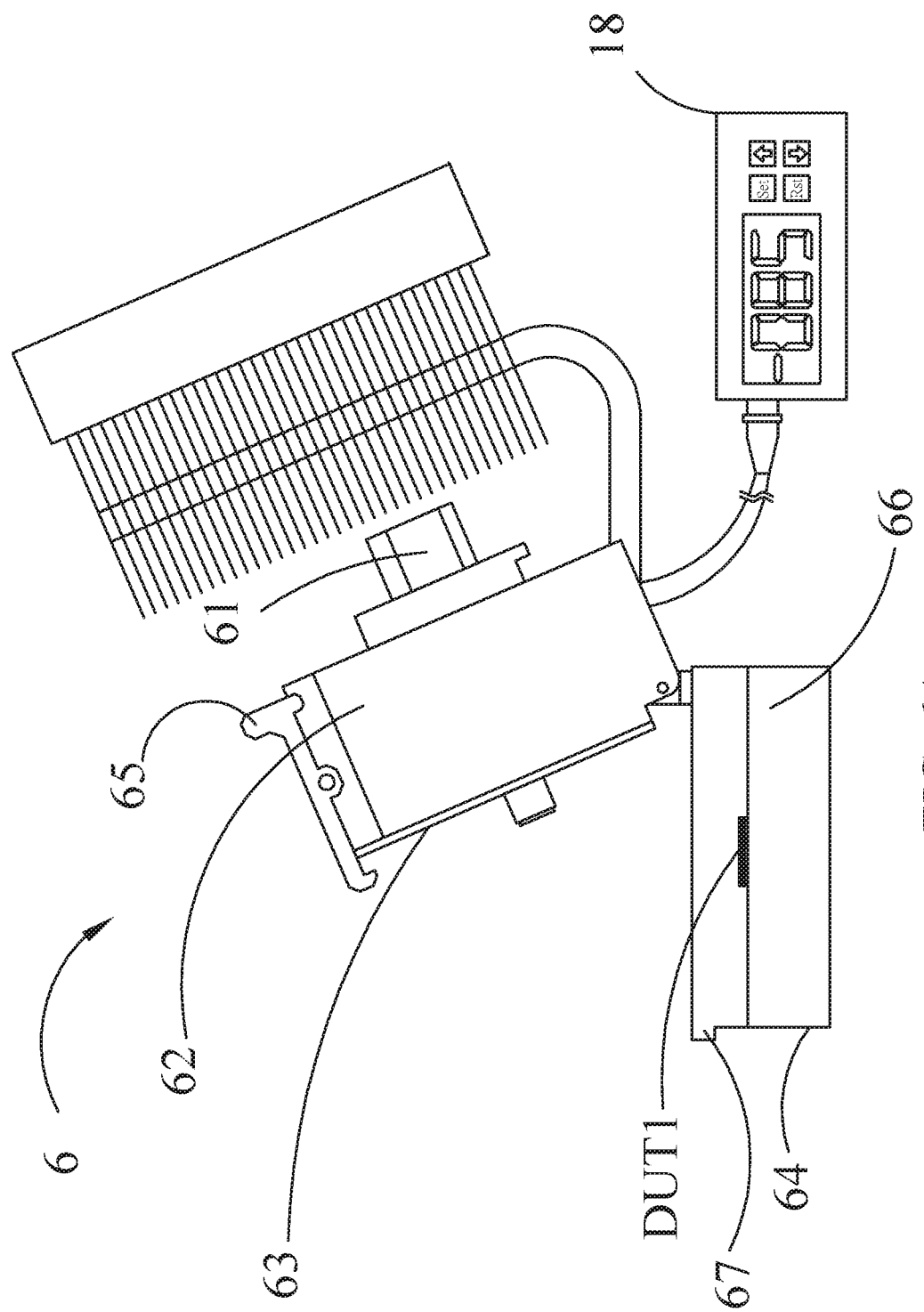
Figure 6B:
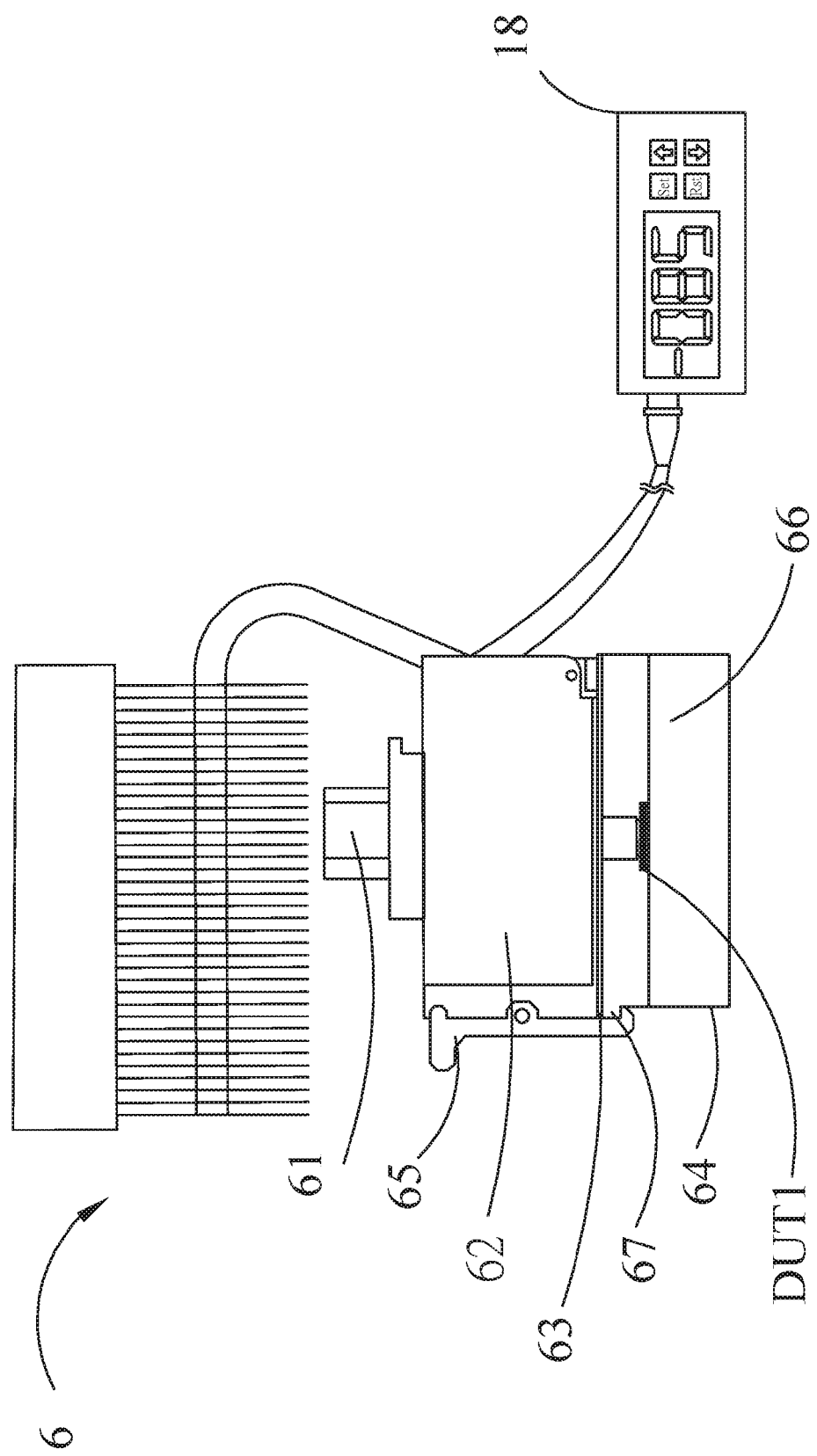
Figure 7:
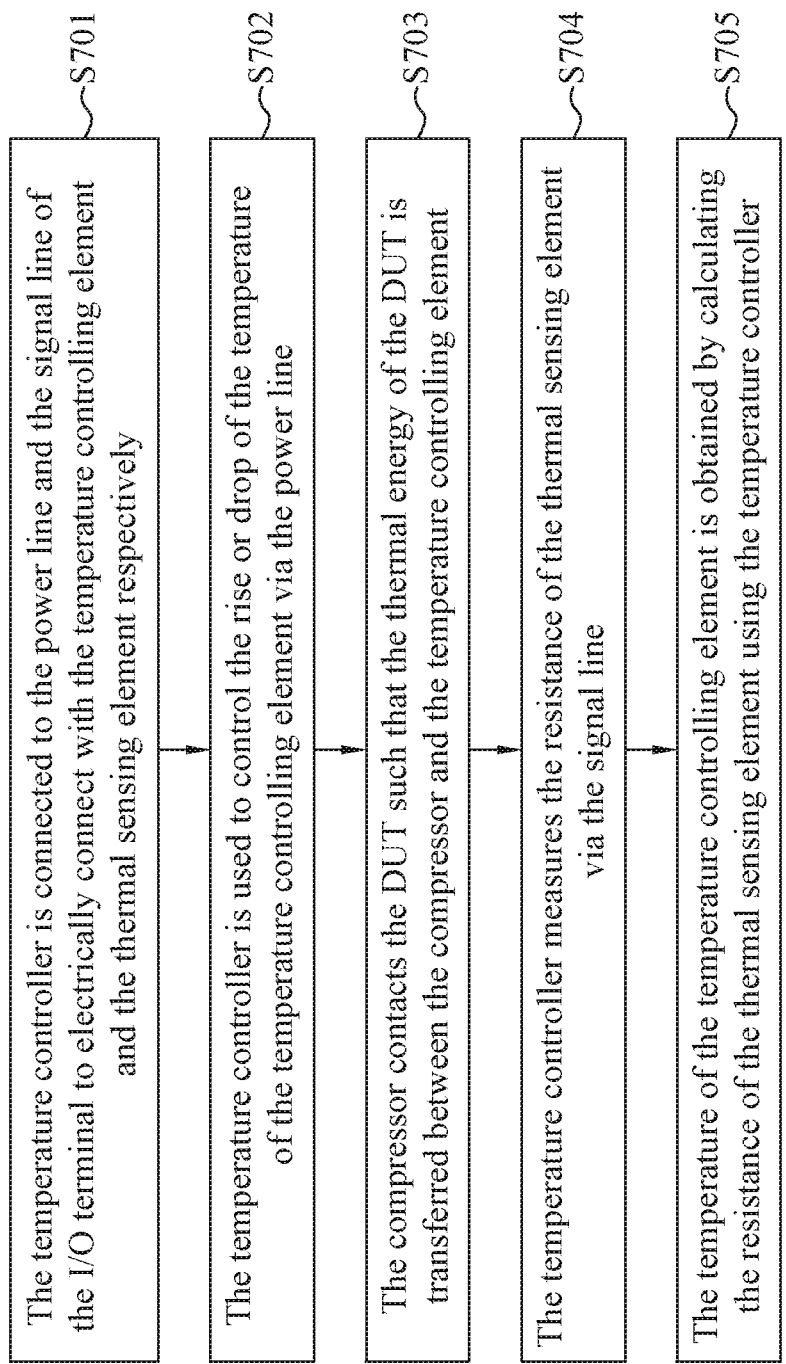
FIG. 7 is the flow chart illustrating the steps according to the embodiment of the method for controlling IC temperature of the present invention.

Hereinafter reference will be made to the attached drawings to further clarify the workflow for the method for controlling IC temperature of the present invention. FIGS. 6A to 6B are the schematic diagrams illustrating temperature control operation of the device for controlling IC temperature of the present invention whereas FIG. 7 is the flow chart illustrating the steps for the method for controlling IC temperature of the present invention. The method for controlling IC temperature of the present invention is applicable to heating or cooling a DUT and detecting the temperature thereof during IC performance test. The method for controlling IC temperature is adaptable to the aforementioned device for controlling IC temperature of the present invention and includes the following steps:

S701: The temperature controller is connected to the power line and the signal line of the I/O terminal to electrically connect with the temperature controlling element and the thermal sensing element respectively. As illustrated in the previous embodiments, the power line and the signal line may be respectively connected to the temperature controlling element and the thermal sensing element through the through hole of the heat insulating structure. Furthermore, the temperature controller can be substituted with a chip having processor, the chip is connected to the computer to execute measurement and control the temperature of the temperature controlling element through software. In addition, the temperature controller may be disposed with the hardware, software or the firmware having the feedback control function illustrated in the previous embodiment, wherein the user can set the test temperature of the DUT via the user interface, when the DUT reaches the predetermined test temperature, the temperature controller will automatically control the temperature controlling element to stop heating or cooling the DUT. On the contrary, when the IC is heated or cooled beyond a threshold value, the temperature controller is able to detect that the DUT has not reached the predetermined temperature and then control the temperature controlling element to continue cooling or heating so that the IC is able to reach the test temperature. With this configuration, the user can be saved from the hassle of having to monitor the temperature at all times and the DUT can be maintained at a stable test temperature.

S702: The temperature controller is used to control the temperature of the temperature controlling element via the power line. In the present step, the user may control the temperature controller via the user interface such that the temperature controlling element is able to reach the predetermined temperature for the IC test. It is noteworthy that the temperature controlling element could be the cooling plate and the anode and cathode of the cooling plate (i.e. temperature controlling element) may be respectively connected to the temperature controller through the reversing switch. The temperature controller is configured to automatically switch the reversing switch to the first conducting state during cooling such that the side of the cooling plate that is in contact with the compressor cools down. Besides, the temperature controller is configured to automatically switch the reversing switch to the second conducting state during heating such that the side of the cooling plate that is in contact with the compressor heats up. The switching operation of the reversing switch has been set forth in the previous embodiments so the details will be omitted here.

S703: The compressor contacts the DUT such that the thermal energy of the DUT is transferred between the compressor and the temperature controlling element. The contact portion may be configured to contact the DUT such that the DUT, thermal sensing element, compressor and the temperature controlling element are able to reach the state of thermal equilibrium. Moreover, in the step of using the temperature controller to control the temperature of the temperature controlling element via the power line, a plurality of heat insulating walls of the heat insulating structure are applied to insulate heat.

S704: The temperature controller measures the resistance of the thermal sensing element via the signal line.

S705: The temperature of the temperature controlling element is obtained by calculating the resistance of the thermal sensing element using the temperature controller.

FIGS. 6A to 6B are the schematic diagrams illustrating temperature control operation of the device for controlling IC temperature of the present invention. As shown in FIG. 6A, the IC under test DUT1 has been placed in the IC socket 64 of the IC heating or cooling performance test system 6 before the initiation of IC heating or cooling performance test. Moreover, the device for controlling IC temperature 1 in FIG. 1 is disposed in the interior of the movable IC socket cover 62 that is half-opened, the IC socket cover 62 is connected to the temperature controller 18. The IC socket 64 is connected to the external IC performance test system through the printed circuit board (PCB) 66. Besides, the IC socket cover 62 may include a locking mechanism 61 situated above the device for controlling IC temperature 1, such that the device for controlling IC temperature 1 and the IC under test DUT1 can be locked when the two come into contact, in order to ensure that the compressor 10 of the device for controlling IC temperature 1 is able to firmly attach to the IC under test DUT1. In addition, a ring washer 63 is disposed at the junction between the IC socket cover 62 and the IC socket 64. The ring washer 63 is a mechanical cushion in ring shape, which might be an annular elastic body typically having a circular cross section, the ring washer 63 may be fixed in an indentation and be compressed by the IC socket cover 62 and the IC socket 64, so as to form a sealed interface. The ring washer 63 is able to withstand pressure up to dozens of Pascal.

A protrusion 67 can be further disposed at the opening of the IC socket cover 62, such that the latching mechanism 65 at the side of the IC socket cover 62 is able to latch on the protrusion 67, so the IC socket cover 62 can be tightly closed. When the IC socket cover 62 is closed tightly, the ring washer 63 further allows an enclosed space to be formed in the interiors of the IC socket cover 62 and the IC socket 64, therefore the air inside the enclosed space provides heat insulation and the rime formation due to the freezing of water vapor on the cold compressor during cooling can be avoided.

As shown in FIG. 6B, during the IC cooling or heating performance test, the contact portion of the compressor comes into direct contact with the IC under test DUT1. Meanwhile, by carrying out the steps S701 to S705 of the embodiment according to the method for controlling IC temperature of the present invention, the temperature of the temperature controlling element can be rapidly determined and the operating performance of the IC under test DUT1 can be tested by the performance test system. After testing, the IC under test DUT1 can be simply replaced in order to proceed to the next round of the performance test. Precisely speaking, with the device and method for controlling IC temperature of the present invention, the time taken to test each device under test is only around 2-3 minutes, and the DUT can be easily replaced to proceed to the next round of performance test, as a result the time and power required for the IC performance test can be significantly reduced.

Figure 6C:
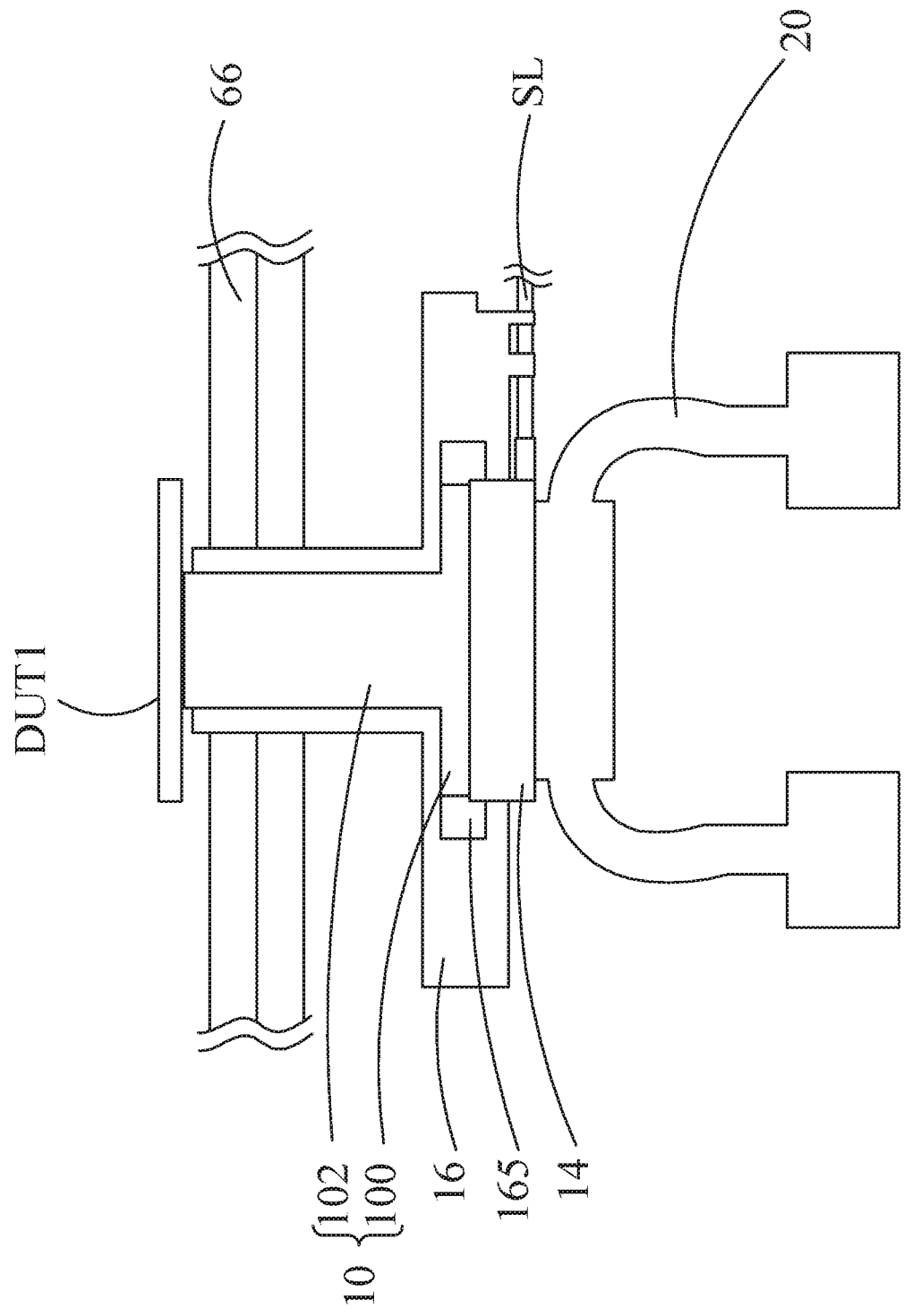

FIGS. 6C to 6D are the schematic diagrams illustrating temperature control operation of another embodiment of the device for controlling IC temperature according to the present invention. As shown in FIGS. 6C and 6D, the device for controlling IC temperature 1 is disposed in the interior of the IC socket cover similar to the FIG. 6A, so unnecessary details are omitted. The difference from the previous embodiment lies in that the device for controlling IC temperature 1 may be disposed under the PCB 66, so as to contact the lower part of the IC under test DUT1 for heating or cooling. In the present embodiment, the compressor 10 may include the base 100 and the contact portion 102, and the contact portion 102 may protrude from the base 100 and directly contact the IC under test DUT1. The temperature controlling element 14 is disposed under the compressor 10, wherein one side thereof contacts the base 100 of the compressor 10 and the other side is attached to the heat dissipation module 20. When the temperature controlling element 14 starts to cool down, the compressor 10 contacting the temperature controlling element 14 cools down as well, and the thermal energy is dissipated from the heat dissipation module 20. When the temperature controlling element 14 starts to heat up, the heat dissipation module 20 is turned off to avoid unnecessary heat loss. With the configuration, it is evident to the person skilled in the art that the device for controlling IC temperature of the present invention can be embedded under the aforementioned IC socket according to user requirement, so as to heat up or cool down the IC under test DUT1 by contacting the lower side thereof, thereby improving the versatility of the present invention.

In conclusion, contrary to techniques known in the art, the device and method for controlling IC temperature of the present invention conducts heat by contacting the tested IC with the compressor, therefore the present invention heats up or cools down the IC by direct contact during the heating or cooling for IC performance test. So in contrast to techniques known in the art which transfer heat by heat convection using a fan, the present invention is faster, simpler, more economic, more convenient, more power saving and environmental friendly. Besides, the heat insulating structure with a plurality of heat insulating wall and outer wall forms a plurality of heat insulating air walls which effectively block unwanted thermal energy from entering the DUT during cooling or effectively prevent the unwanted loss of thermal energy during heating, such that the rate of heating or cooling of the DUT is accelerated accordingly. Furthermore, the temperature controller of the present invention is capable of accurately measuring the temperature of the temperature controlling element when the temperature controlling element, compressor and DUT reaches thermal equilibrium due to the closed loop formed by the power line, signal line, and the temperature controller, thereby being highly adaptable and accelerating efficiency during measuring. Furthermore, the present invention may be disposed with the cooling plate and the reversing switch to achieve the function of heating and cooling without the need for additional elements. Besides, in certain embodiments of the present invention, the temperature controller is able to precisely control the temperature of the temperature controlling element through the power line and the signal line, therefore the present invention is highly adaptable and has high test efficiency.

The present invention has been described with some preferred embodiments thereof and it is understood that many changes and modifications in the described embodiments can be carried out without departing from the scope and the spirit of the invention that is intended to be limited only by the appended claims.

What is claimed is:

1. A device for controlling IC temperature, adapted for bringing a device-under-test (DUT) to a predetermined temperature for testing, comprising:
    a compressor having a base and a contact portion, wherein the contact portion extends from the base and is configured to directly contact the DUT;
    a temperature controlling element disposed on the compressor, wherein one side of the temperature controlling element contacts the base and the other side is disposed with a heat dissipation module;
    a thermal sensing element attached to the temperature controlling element;
    a heat insulating structure disposed around the temperature controlling element and at least a portion of the compressor while at least partially exposing the contact portion, the heat insulating structure comprising an accommodation space for accommodating the temperature controlling element and at least the portion of the compressor;
    an input/output (I/O) terminal disposed on the heat insulating structure, the I/O terminal comprising a power line and a signal line, wherein the power line is electrically connected to the temperature controlling element and the signal line is electrically connected to the thermal sensing element; and
    a temperature controller connected to the power line and the signal line, wherein the temperature controller supplies power to the power line, controls rise or drop of a temperature of the temperature controlling element, and measures electrical properties of the thermal sensing element via the signal line to calculate the temperature of the temperature controlling element.

2. The device for controlling IC temperature of claim 1, wherein the temperature controller comprises a user interface for controlling and displaying the temperature of the temperature controlling element.

3. The device for controlling IC temperature of claim 1, wherein the heat insulating structure comprises:
    an upper base having an upper hollow portion at a center thereof;
    a lower base disposed opposite to the upper base and having a lower hollow portion at a center thereof;
    an outer wall interposed between the upper base and the lower base along an outermost region of the upper base and the lower base; and
    at least one heat insulating recess interposed between the upper base and the lower base, wherein the at least one heat insulating recess, the upper base, the lower base, the temperature controlling element and at least the portion of the compressor cooperatively form at least one enclosed space.

4. The device for controlling IC temperature of claim 1, wherein the temperature controlling element comprises a cooling plate, an anode and a cathode of the cooling plate are respectively connected to the temperature controller via a reversing switch, the temperature controller is configured to switch the reversing switch to a first conducting state during cooling or switch to a second conducting state during heating, such that a side of the cooling plate contacting the compressor cools down or heats up accordingly.

5. A device for controlling IC temperature, adapted for adjusting a temperature of a device-under-test (DUT) to a predetermined value for testing, comprising:
    a compressor having a base and a plurality of contact portions, wherein the plurality of contact portions extend from the base and are configured to directly contact the DUT;
    at least one temperature controlling element disposed on the compressor and contacting the base;
    a thermal sensing element attached to the temperature controlling element;
    a heat insulating structure disposed around the at least one temperature controlling element and at least a portion of the compressor, the heat insulating structure comprising an accommodation space for accommodating the at least one temperature controlling element and at least the portion of the compressor; and
    an input/output (I/O) terminal disposed on the heat insulating structure, the I/O terminal comprising at least a power line and a signal line, wherein the power line is electrically connected to the at least one temperature controlling element and the signal line is electrically connected to the thermal sensing element.

6. The device for controlling IC temperature of claim 5, further comprising a temperature controller connected to the power line and the signal line, wherein the temperature controller supplies power to the power line, adjusts a temperature of the temperature controlling element, and measures electrical properties of the thermal sensing element via the signal line to calculate the temperature of the temperature controlling element.

7. The device for controlling IC temperature of claim 5, further comprising a heat dissipation module disposed on the temperature controlling element.

8. The device for controlling IC temperature of claim 5, wherein the heat insulating structure comprises:
    an upper base having an upper hollow portion at a center thereof;

a lower base disposed opposite to the upper base and having a lower hollow portion at a center thereof;

an outer wall interposed between the upper base and the lower base along an outermost region of the upper base and the lower base; and at least one heat insulating recess interposed between the upper base and the lower base, wherein the at least one heat insulating recess, the upper base, the lower base, the temperature controlling element and at least the portion of the compressor cooperatively form at least one enclosed space.

9. The device for controlling IC temperature of claim 8, wherein the temperature controlling element comprises a cooling plate, an anode and a cathode of the cooling plate are respectively connected to the temperature controller via a reversing switch, the temperature controller is configured to switch the reversing switch to a first conducting state during cooling or switch to a second conducting state during heating, such that a side of the cooling plate contacting the compressor cools down or heats up accordingly.

10. A method for controlling IC temperature, the method comprising steps as follows:

connecting a temperature controller of a device for controlling IC temperature to a power line and a signal line of an I/O terminal for electrically connecting a temperature controlling element and a thermal sensing element respectively;

wherein the device for controlling IC temperature comprises:

a compressor having a base and a contact portion, wherein the contact portion extends from the base;

the temperature controlling element disposed on the compressor, wherein one side of the temperature controlling element contacts the base and the other side is disposed with a heat dissipation module;

the thermal sensing element attached to the temperature controlling element;

a heat insulating structure disposed around the temperature controlling element and at least a portion of the compressor while at least partially exposing the contact portion, the heat insulating structure comprising an accommodation space for accommodating the temperature controlling element and at least the portion of the compressor;

the input/output (I/O) terminal disposed on the heat insulating structure; and the temperature controller, wherein the temperature controller supplies power to the power line and measures electrical properties of the thermal sensing element via the signal line to calculate the temperature of the temperature controlling element;

using the temperature controller to control rise or drop of the temperature of the temperature controlling element via the power line;

contacting the compressor with a device-under-test (DUT) to allow heat transfer between the DUT and the temperature controlling element;

controlling the temperature controller to measure electrical properties of the thermal sensing element via the signal line; and obtaining the temperature of the temperature controlling element by calculating electrical properties of the thermal sensing element using the temperature controller.

\* \* \* \* \*